(12) United States Patent
Kwon (10) Patent No.: US 10,090,055 B2
(45) Date of Patent: Oct. 2, 2018

(54) MEMORY DEVICE HAVING NEGATIVE VOLTAGE GENERATOR

(71) Applicant: SK hynix Inc., Gyeonggi-do (KR)

(72) Inventor: Tae Heui Kwon, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/465,999

(22) Filed: Mar. 22, 2017

(65) Prior Publication Data

US 2018/0019015 A1   Jan. 18, 2018

(30) Foreign Application Priority Data

Jul. 15, 2016   (KR) .......................... 10-2016-0090133

(51) Int. Cl.
| | | |
|---|---|---|
| G05F 1/10 | (2006.01) | |
| G11C 16/26 | (2006.01) | |
| G11C 16/10 | (2006.01) | |
| G11C 16/08 | (2006.01) | |

(52) U.S. Cl.
CPC .............. *G11C 16/26* (2013.01); *G11C 16/08* (2013.01); *G11C 16/10* (2013.01)

(58) Field of Classification Search
CPC .......... G11C 16/26; G11C 16/10; G11C 16/08
USPC .................................................. 365/185.12
See application file for complete search history.

(56) References Cited

U.S. PATENT DOCUMENTS

| | | | | |
|---|---|---|---|---|
| 5,835,420 A | * | 11/1998 | Lee ......................... | G11C 5/147 365/189.07 |
| 6,888,340 B1 | * | 5/2005 | Chen ....................... | H02M 3/07 323/313 |
| 7,015,684 B2 | * | 3/2006 | Chen ....................... | H02M 3/07 323/313 |
| 7,394,306 B2 | * | 7/2008 | Chen ....................... | G05F 1/618 323/273 |
| 2005/0194956 A1 | * | 9/2005 | Chen ....................... | H02M 3/07 323/316 |
| 2007/0164810 A1 | * | 7/2007 | Chen ....................... | G05F 1/618 327/541 |

FOREIGN PATENT DOCUMENTS

| | | |
|---|---|---|
| KR | 1020120033724 | 4/2012 |
| KR | 1020120079371 | 7/2012 |
| KR | 101354608 | 1/2014 |

\* cited by examiner

*Primary Examiner* — Richard Elms
*Assistant Examiner* — Xiaochun L Chen
(74) *Attorney, Agent, or Firm* — IP & T Group LLP (57) ABSTRACT

Provided herein is a voltage generating circuit including: a negative voltage pump configured to generate a first negative voltage; and a negative voltage regulator configured to generate a second negative voltage using the first negative voltage and output the second negative voltage through an output terminal. The negative voltage regulator includes a first amplifier circuit configured to be controlled by a voltage of the output terminal, and a voltage booster configured to increase a voltage of the output terminal depending on an output voltage of the first amplifier circuit.

15 Claims, 8 Drawing Sheets

MEMORY DEVICE HAVING NEGATIVE VOLTAGE GENERATOR

CROSS-REFERENCE TO RELATED APPLICATION

The present application claims priority under 35 U.S.C. § 119(a) to Korean patent application number 10-2016-0090133 filed on Jul. 15, 2016, which is herein incorporated by reference in its entirety.

BACKGROUND

1. Field

Various embodiments of the present disclosure relate to a memory device including a voltage generator.

2. Description of Related Art

With the increase in demand of cellular phones, portable memory devices and digital cameras, demand of non-volatile memory devices which are mainly used as memory devices for such products is also increasing. Among the non-volatile memory devices, NAND flash memory devices are widely used as data storage devices.

A NAND flash memory device includes a voltage generator for generating a plurality of voltages including a read voltage that are applied to word lines. Using a voltage generator, the NAND flash memory device performs operations which are required for reading data which are stored in memory cells and transmitting them to a host device.

Improved portable digital devices demand higher data usage and, therefore, smaller, faster and larger capacity memory devices.

SUMMARY

Various embodiments of the present disclosure are directed to a memory device exhibiting an improved read speed. The memory device employs a negative voltage generator that generates a negative target voltage reliably and rapidly.

One embodiment of the present disclosure provides a voltage generating circuit including: a negative voltage pump configured to generate a first negative voltage; and a negative voltage regulator configured to generate a second negative voltage using the first negative voltage and output the second negative voltage through an output terminal. The negative voltage regulator comprises an amplifier circuit configured to be controlled by a voltage of the output terminal, and a voltage booster configured to increase a voltage of the output terminal depending on an output voltage of the first amplifier circuit.

Another embodiment of the present disclosure provides a memory device including: a memory cell array; a negative voltage pump configured to generate a first negative voltage; a negative voltage regulator configured to generate a second negative voltage using the first negative voltage and output the second negative voltage through an output terminal; and a row decoder configured to apply the second negative voltage to the memory cell array. The negative voltage regulator comprises a first amplifier circuit configured to be controlled by a voltage of the output terminal, and a voltage booster including a first transistor that is coupled to the output terminal and configured to be controlled an output voltage of the first amplifier circuit. The voltage booster is configured so that the voltage of the output terminal is increased by a charge supplied through the first transistor.

Still another embodiment of the present disclosure provides a memory device including: a memory cell array; a negative voltage pump configured to generate a first negative voltage; a negative voltage regulator configured to generate a second negative voltage and a third negative voltage higher than the second negative voltage depending on the first negative voltage and output the second negative voltage and the third negative voltage through an output terminal; a row decoder configured to successively apply the second negative voltage and the third negative voltage to the memory cell array; and a page buffer unit configured to store data outputted from the memory cell array in response to the second negative voltage and the third negative voltage. The negative voltage regulator comprises a first amplifier circuit configured to be controlled by a voltage of the output terminal, and a first transistor coupled to the output terminal and configured to be controlled by an output voltage of the first amplifier circuit. The voltage of the output terminal is increased from a second negative voltage to a third negative voltage by a charge supplied through the first transistor.

BRIEF DESCRIPTION OF THE DRAWINGS

Example embodiments will now be described more fully hereinafter with reference to the accompanying drawings in which.

DETAILED DESCRIPTION

Hereinafter, various embodiments of the present invention are described in detail with reference to the accompanying drawings. However, it is noted that the invention may be embodied in different forms and should not be construed as limited to the embodiments set forth herein. Rather, the described embodiments are provided so that this disclosure will be thorough and complete, and will fully convey the invention to those skilled in the art to which the present invention pertains.

In the drawing figures, dimensions may be exaggerated for clarity of illustration. It will be further understood that when an element is referred to as being "between" two elements, it can be the only element between the two elements, or one or more intervening elements may also be present. Like reference numerals refer to like elements throughout.

Moreover, it is noted, that the embodiments are described herein with reference to simplified, schematic illustrations.

As such, variations from the shapes of the illustrations are to be expected. For example, variations may occur due to manufacturing techniques and/or tolerances. Thus, embodiments should not be construed as limited to the particular shapes illustrated herein but may include deviations in shapes that result, for example, from manufacturing. Furthermore, in some instances, various parts of the drawings may have been exaggerated in order to more clearly illustrate certain features of the illustrated embodiments. For example, in the drawings, lengths and sizes of various regions may be exaggerated for clarity.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure.

As used herein, singular forms are intended to include the plural forms as well, unless the context clearly indicates otherwise.

It will be further understood that the terms "comprises," "comprising," "includes," and "including" when used in this specification, are inclusive terms that specify the presence of any stated elements but do not preclude the presence or addition of one or more other elements.

As used herein, the term "and/or" Includes any and all combinations of one or more of the associated listed items.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

It is further noted that in the following description, specific details are set forth for facilitating the understanding of the present invention, however, the present invention may be practiced without some of these specific details. Also, it is noted, that well-known structures and/or processes may have only been described briefly or not described at all to avoid obscuring the present disclosure with unnecessary well known details.

In some instances, as would be apparent to those skilled in the relevant art, an element described in connection with one embodiment may be used singly or in combination with other elements of another embodiment, unless specifically indicated otherwise.

Hereinafter, the various embodiments of the present invention will be described in detail with reference to the attached drawings.

Figure 1:
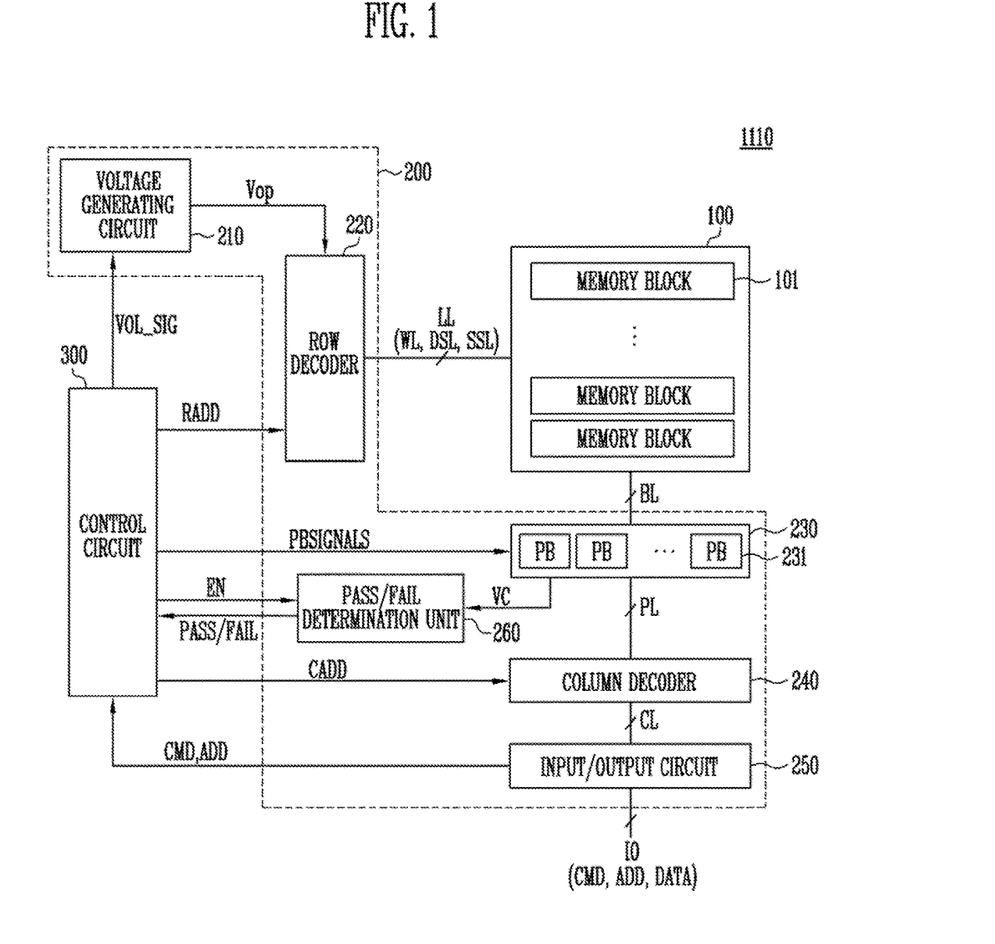
FIG. 1 is a block diagram illustrating a memory device according to an embodiment of the present disclosure.

Referring now to FIG. 1, a memory device 1110 is provided, according to an embodiment of the present disclosure.

Accordingly, the memory device 1110 of FIG. 1, may include a memory cell array 100 which is configured to store data, a peripheral circuit 200 which is configured to program data to the memory cell array 100, read the programmed data and output the data to the outside or erase data in the memory cell array 100, and a control circuit 300 which is configured to control the peripheral circuit 200.

The memory cell array 100 includes a plurality of memory blocks 101. Local lines LL and bit lines BL may be coupled to the respective memory blocks 101. The local lines LL are coupled to the respective memory blocks 101, and the bit lines BL are coupled in common to a plurality of the memory blocks 101. In an embodiment, each local line LL may be coupled to only one memory block while each bit line is coupled in common to all the memory blocks. The memory cell array 100 may be configured as a two-dimensional memory array. Preferably, the memory cell array 100 may be configured as a three-dimensional (3D) memory array in which memory cells are stacked in a direction perpendicular to a semiconductor substrate.

The peripheral circuit 200 may include a voltage generating circuit 210, a row decoder 220, a page buffer unit 230, a column decoder 240, an input/output circuit 250, and a pass/fail determination unit 260.

The voltage generating circuit 210 may generate one or more operating voltages Vop to be used for program, read, or erase operations in response to a voltage generating signal VOL_SIG received from the control circuit 300. For example, the voltage generating circuit 210 may generate a program voltage, a pass voltage, a read voltage and an erase voltage in response to the voltage generating signal VOL_SIG supplied from the control circuit 300. The program, pass, read and erase voltages may have different levels from one another. The level of each of the program, pass, read and erase voltages may be varied on design. For example, the voltage generating circuit 210 may generate one or more positive read voltages and one or more negative read voltages.

The memory cell array 100 may include a plurality of multi-level cells (MLC) capable of storing two or more of logic bits in each cell. For example, multi-level cells (MLC) may include two-level cells storing two logic bits, triple-level cells (TLC) storing three logic bits, and quadruple-level cells (QLC) storing four logic bits. For storing a large amount of logic bits, the memory cell array 100 may be configured so that a threshold voltage corresponding to a program state is formed in a negative region (for example, a threshold voltage region lower than 0V). To read the program state that is formed in the negative region, the voltage generating circuit 210 may generate at least one negative read voltage.

The speed at which a read voltage is generated by the voltage generating circuit 200 may affect the read performance of the memory device 1110. For example, in the case of multi-level cells such as two-level cells or triple-level cells (TLC), a plurality of read voltages are required to read a single logic bit. In addition, the plurality of read voltages may include at least one negative read voltage. The speed at which the read voltages are generated may affect the read performance of the memory device 1110.

The row decoder 220 may transmit the operating voltages Vop generated by the voltage generating circuit 210 to one or more of the local lines LL that are coupled to a selected memory block, in response to a row address RADD supplied from the control circuit 300 as may be needed based on the operation to be performed. For example, the row decoder 220 may provide one or more of the operating voltages Vop to word lines WL that are coupled to the selected memory block among the local lines LL. Furthermore, the row decoder 220 may provide one or more of the operating voltages Vop not only to the word lines WL but also to a drain select line DSL and a source select line SSL among the local lines LL that are coupled to the selected memory block.

The page buffer unit 230 includes a plurality of page buffers 231 which are coupled to the bit lines BL. In an embodiment, at least one page buffer 231 may be coupled to each bit line BL. The page buffers 231 may exchange data with the memory cell array 100 through the bit lines BL, and temporarily store data received from a selected memory block. In response to a plurality of positive read voltages and at least one negative read voltage, data outputted from the memory cell array 100 may be temporarily stored in the page buffers (PB) 231 through the bit lines BL.

The column decoder 240 receives data from the page buffers 231 through page lines PL in response to a column address CADD received from the control circuit 300. In an embodiment at least one page line may be coupled to each page buffer 231. Any suitable page decoder may be employed.

The input/output circuit 250 may receive a command, CMD, an address ADD from an external device and may transmit the command CMD, and the address ADD to the control circuit 300. The input/output circuit 250 may exchange data DATA with the external device. The input/output circuit 250 may also exchange data with the column decoder 240 coupled thereto through a plurality of column lines CL. Any suitable input/output circuit may be employed.

The pass/fail determination unit 260 determines whether a program operation or an erase operation that is being performed passes or fails, depending on a voltage VC or a current (not shown) that is received from the page buffer unit 230 in response to an enable signal EN received from the control circuit 300, and transmits a pass signal PASS or a fail signal FAIL to the control circuit 300. Any suitable pass/fail determination unit may be employed.

The control logic 300 may output to the various units of the peripheral circuit 200, the voltage generating signal VOL_SIG, the row address RADD, the page buffer control signals PBSIGNALS, the enable signal EN and the column address CADD, in response to the command CMD and the address ADD received from the input/output circuit 250, thus controlling the peripheral circuit 200.

Figure 2:
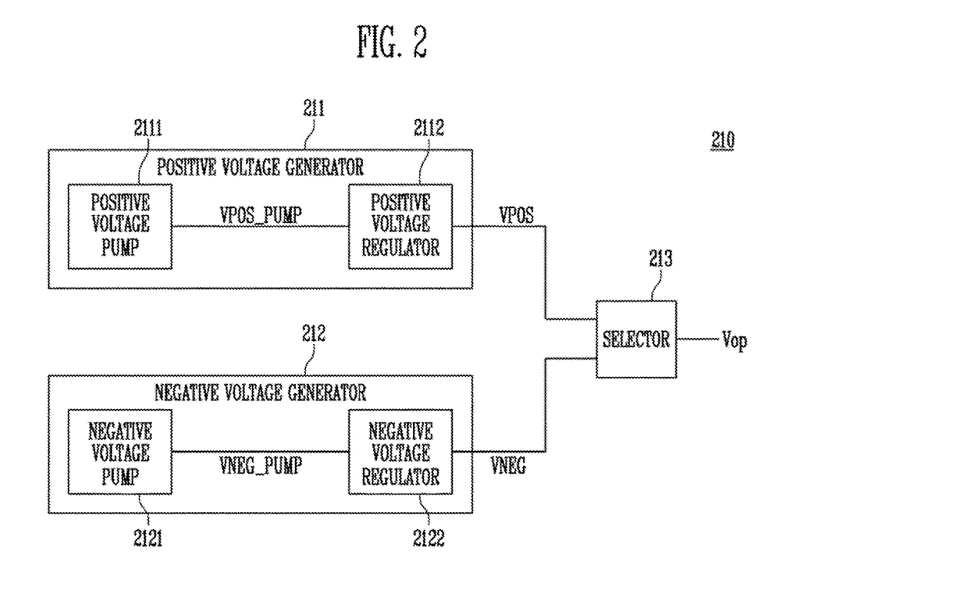
FIG. 2 is a block diagram illustrating a voltage generating circuit employed in the memory device of FIG. 1, according to an embodiment of the present disclosure.

FIG. 2 is a block diagram illustrating a configuration example of the voltage generating circuit 210 of FIG. 1.

Referring to FIG. 2, the voltage generating circuit 210 may include a positive voltage generator 211 and a negative voltage generator 212 operatively coupled to a selector 213. The positive voltage generator 211 may generate a plurality of positive read voltages VPOS, using a positive voltage pump 2111 and a positive voltage regulator 2112. The positive voltage pump 2111 may perform a charge pumping operation and thus generate a positive pumping voltage VPOS_PUMP having a high level from a supply voltage. The positive voltage regulator 2112 may regulate the positive pumping voltage VPOS_PUMP received from the positive voltage pump 2111 to thus generate a plurality of positive read voltages VPOS that are applied to the word lines WL of FIG. 1 during a read operation. For example, the plurality of positive read voltages VPOS may be equal to or lower than the positive pumping voltage VPOS_PUMP. The plurality of positive read voltages VPOS may be used to read a program distribution having a high threshold voltage in the two-level cells or the triple level cells (TLC).

The positive voltage regulator 2112 may generate a positive program voltage and a positive program verify voltage or a positive erase voltage and a positive erase verify voltage, as well as the positive read voltages VPOS.

The negative voltage generator 212 may generate at least one negative read voltage VNEG using a negative voltage pump 2121 and a negative voltage regulator 2122. The negative voltage pump 2121 may perform a negative charge pumping operation and thus generate a negative pumping voltage VNEG_PUMP as a first negative voltage from the supply voltage or the ground voltage. The negative voltage regulator 2122 may regulate the negative pumping voltage VNEG_PUMP and thus generate one or more negative read voltages VNEG as a second negative voltage that are applied to the word lines WL of FIG. 1 during a read operation. For example, the negative read voltage VNEG is equal to or higher than the negative pumping voltage VNEG_PUMP. Furthermore, the negative read voltage VNEG may be used to read a program distribution or an erase distribution having a low threshold voltage in the multi-level cells (MLC) such as the two-level or the triple level cells (TLC).

The negative voltage regulator 2122 may generate a negative program voltage and a negative program verify voltage or a negative erase voltage and a negative erase verify voltage, as well as the negative read voltage VNEG.

A selector 213 may select one of the positive read voltages VPOS that are the output of the positive voltage generator 211 and the negative read voltage VNEG that is the output of the negative voltage generator 212, depending on a level of a target read voltage required for a read operation, and output it as an operating voltage Vop to the row decoder 220 of FIG. 1.

Figure 3:
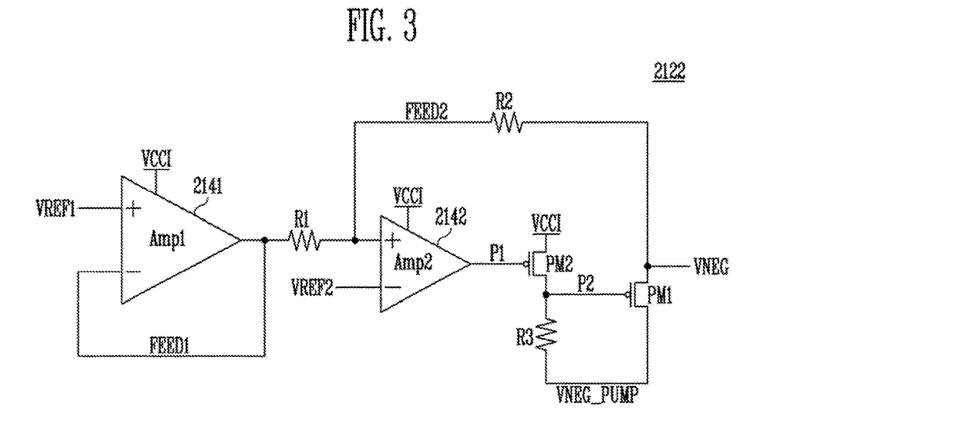
FIG. 3 is a diagram illustrating a negative voltage regulator employed in the voltage generating circuit of FIG. 2, according to an embodiment of the present disclosure.

FIG. 3 is a diagram illustrating a negative voltage regulator 3122 according to an embodiment of the present invention. The negative voltage regulator 3122 may be employed in the voltage generating circuit 210 of FIG. 2 as the negative voltage regulator 2122.

Referring to FIG. 3, the negative voltage regulator 3122 may include first and second amplifier circuits 2141 and 2142, first, second and third resistors R1, R2 and R3, and first and second PMOS transistors PM1 and PM2. The first resistor R1 is coupled between an output terminal of the first amplifier circuit 2141 and a non-inverting input terminal of the second amplifier circuit 2142. The second resistor R2 is coupled between the non-inverting input terminal of the second amplifier circuit 2142 and the negative read voltage VNEG output node. The third resistor R3 is coupled between the first and second PMOS transistors PM1 and PM2. The output terminal of the second amplifier circuit 2142 is coupled to the gate of the second PMOS transistor. The gate of the first PMOS transistor is coupled to a common node between the third resistor R3 and the second PMOS transistor PM2.

Referring to FIG. 3, the negative read voltage VNEG that is the output of the negative voltage regulator 3122 is determined by a first reference voltage VREF1 fed to the noninverting input terminal of the first amplifier circuit 2141, a second reference voltage VREF2 fed to the inverting input terminal of the second amplifier circuit 2142 and a ratio of the resistance of the second resistor R2 over the resistance of the first resistor R1. A current 'I' is flowing from the negative read voltage VNEG node through the second resistor R2 to a second feed FEED2 coupled to the noninverting input terminal of the second amplifier circuit 2142. The voltage of the second feed FEED2 is controlled to be the same as the second reference voltage VREF2 when the negative voltage regulator 3122 operates. Therefore, the following equation 1 is satisfied.

$$VNEG - I \times R2 = VREF2 \quad (1)$$

In addition, the current I flowing through the second resistor R2 is the same as current flowing through the first resistor R1. The voltage of a first feed FEED1 which is coupled between the output node of the first amplifier circuit 2141 and the inverting input node of the first amplifier circuit 2141 is controlled to be the same as the first reference voltage VREF1 when the negative voltage regulator 3122 operates. Therefore, the following equation 2 is satisfied.

$$VNEG - I \times (R1 + R2) = VREF1 \quad (2)$$

Combining equations 1 and 2 lead to the following expression:

$$VNEG = (1 + (R2 \div R1)) \times VREF2 - (R2 \div R1) \times VREF1 \quad (3)$$

That is, the negative read voltage VNEG which is the output of the negative voltage regulator 3122 is determined by the first reference voltage VREF1, the second reference voltage VREF2 and the ratio of the resistance of the second resistor R2 over the resistance of the first resistor R1. If the second reference voltage VREF2 is the ground voltage, the negative read voltage VNEG that is the output of the negative voltage regulator 3122 is provided by the following formula:

$$VNEG = -(R2 \div R1) \times VREF1 \quad (4)$$

Here, for example, if the first reference voltage VREF1 is 1 V, the negative read voltage VNEG that is the output of the negative voltage regulator 3122 may be determined by the ratio of the resistance of the second resistor R2 over the resistance of the first resistor R1, as follows.

$$VNEG = -(R2 \div R1) \quad (5)$$

In the negative voltage regulator 3122, the first resistor R1 and/or the second resistor R2 may be configured of a variable resistor to generate negative read voltages VNEG having various levels.

When the voltage level of the negative read voltage VNEG that is the output of the negative voltage regulator 3122 is higher than that of a negative target read voltage, the negative read voltage VNEG receives a negative charge through the first P-channel metal-oxide semiconductor (PMOS) transistor PM1, with a negative pumping voltage VNEG_PUMP that is the output of the negative voltage pump 2121 as a source. As a result, the voltage level of the negative read voltage VNEG is reduced. For example, description will be made for the case where a start voltage of the negative read voltage VNEG is 0V and the negative target read voltage is minus one volt, i.e., "−1V". First, when the voltage of the second feed FEED2 becomes higher than the second reference voltage VREF2, P1 that is the output of the second amplifier circuit (Amp2) 2142 becomes a high level. Consequently, P2 at the drain terminal of the second PMOS transistor PM2 becomes a low level, whereby the first PMOS transistor PM1 is turned on. Therefore, a negative charge is transferred from the negative pumping voltage VNEG_PUMP to the negative read voltage VNEG through the first PMOS transistor PM1, so that the voltage level of the negative read voltage VNEG is reduced. The negative read voltage VNEG may be rapidly reduced by using, as the first PMOS transistor PM1, a transistor that has a high current driving force. The output of the second amplifier circuit (Amp2) 2142 may vary depending upon the negative read voltage VNEG which is fed back to the non-Inverting input terminal of the second amplifier circuit (Amp2) 2142.

When the voltage level of the negative read voltage VNEG is lower than that of the target read voltage, the voltage of the second feed FEED2 becomes lower than the second reference voltage VREF2 and P1 becomes a low level. As a result, P2 becomes a high level and the first PMOS transistor PM1 is weakly turned on or off. A positive charge is transferred to the negative read voltage VNEG via the first resistor R1 and the second resistor R2, with an internal supply voltage VCCI as a source, so that the voltage level of the negative read voltage VNEG is increased. Here, a path including the first resistor R1 and the second resistor R2 through which a positive charge is supplied may have very low current driving force compared to that of the first PMOS transistor PM1. The first resistor R1 and the second resistor R2 may be configured to provide low resistance so that the current driving force is increased. However, in this case, current consumption of the memory device 1110 may generally increase. A low current driving force on the path including the first resistor R1 and the second resistor R2 may increase the time it takes to stabilize the target voltage when the negative read voltage VNEG is changed from a low negative voltage to a comparatively high negative voltage. Such an increase in the time it takes to stabilize the target voltage may reduce the read performance of the memory device 1110.

A third resistor R3 may be configured to provide a sufficiently high resistance to make, when the second PMOS transistor PM2 is turned on, P2 be a voltage close to the internal supply voltage VCCI applied to the source terminal of the second PMOS transistor and thus turn off the first PMOS transistor PM1.

Figure 4:
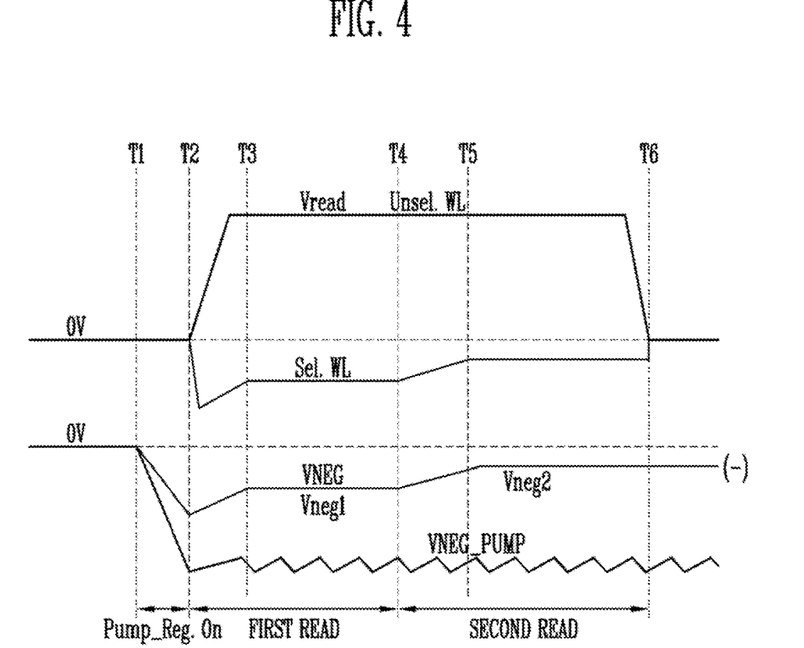
FIG. 4 is a timing diagram illustrating generation of a negative voltage using the negative voltage regulator of FIG. 3.

FIG. 4 is a timing diagram illustrating generation of a negative voltage using the negative voltage regulator 3122 of FIG. 3.

Referring to FIG. 4, during a read operation, a positive voltage Vread is applied to an unselected word line, and a target read voltage is applied to a selected word line for determining data stored in the memory cells of the memory cell array 100 which are coupled to the selected word line. For example, the positive voltage which is applied to the unselected word line during a read operation may range from about 4V to about 8V Once the read operation is initiated, either the positive voltage generator 211 (i.e., the positive voltage pump 2111 and the positive voltage regulator 2112) or the negative voltage generator 212 (i.e., the negative voltage pump 2121 and the negative voltage regulator 3122) of FIG. 2 may first operate to generate a target read voltage. Specifically, if the target read voltage is a negative voltage, the negative voltage generator 212, i.e., the negative voltage pump 2121 and the negative voltage regulator 3122 are first activated. A start voltage of the negative read voltage VNEG that is the output of the negative voltage regulator 3122 may be the ground voltage. A target read voltage of a first read operation is a first negative target read voltage Vneg1. The negative voltage pump 2121 generates a negative pumping voltage VNEG_PUMP equal to or lower than the first negative target read voltage Vneg1. In addition, the negative pumping voltage VNEG_PUMP may be a voltage that is lower than the first negative target read voltage Vneg1 by the absolute value of a threshold voltage of the first PMOS transistor PM1 or more. During a period from T1 to T2, the first PMOS transistor PM1 of the negative voltage regulator 3122 is turned on, and the voltage level of the negative read voltage VNEG begins to be reduced by a negative charge supplied from the negative pumping voltage VNEG_PUMP through the first PMOS transistor PM1. Here, the current driving force of the first PMOS transistor PM1 is higher than that of the path of the first resistor R1 and the second resistor R2, and the time required to transfer variation of the negative read voltage to the second feed FEED2 is delayed. Thereby, the negative read voltage VNEG is reduced to a voltage lower than the first negative target read voltage Vneg1. This refers to an undershoot phenomenon. The undershoot phenomenon may last until the first PMOS transistor PM1 is turned off. When a difference between the negative read voltage VNEG and the negative pumping voltage VNEG_PUMP is equal to or less than the absolute value of threshold voltage of the first PMOS transistor PM1, the negative read voltage VNEG is no longer reduced. By variation in the phase of the P1 of FIG. 3, during a period from T2 to T3, the current driving force of the first PMOS transistor PM1 is reduced. In addition, a positive charge is transferred to the negative read voltage VNEG through the path of the first resistor R1 and the second resistor R2 of FIG. 3. Thereby, the negative voltage VNEG is increased to the first negative target read voltage Vneg1. In this regard, the negative read voltage VNEG slowly increases because the current driving force of the path including the first resistor R1 and the second resistor R2 is comparatively small. Therefore, much time may be required to generate the first negative target read voltage Vneg1.

If the generation of the first negative target read voltage Vneg1 has been completed, the first negative target read voltage Vneg1 is applied to the memory cell array 100 through the row decoder 220. During a period from T3 to T4, data stored in the memory cell array 100 may be outputted and temporarily stored in the page buffers 231.

A target voltage of a second read operation is a second negative target read voltage Vneg2. The second negative target read voltage Vneg2 may be higher than the first negative target read voltage Vneg1. When the second read operation is initiated at time T4, during a period from T4 to T5, the first negative target read voltage Vneg1 is switched to the second negative target read voltage Vneg2. Furthermore, when the first negative target read voltage Vneg1 is switched to the second negative target read voltage Vneg2, the first negative target read voltage Vneg1 may be directly switched to the second negative target voltage Vneg2 without passing through a voltage such as the ground voltage or supply voltage that is not present between the first negative target read voltage Vneg1 and the second negative target read voltage Vneg2. Because the second negative target read voltage Vneg2 is higher than the first negative target read voltage Vneg1, during the period from T4 to T5, the current driving force of the first PMOS transistor PM1 is still reduced. Furthermore, a positive charge is transferred to the negative read voltage VNEG through the path including the first resistor R1 and the second resistor R2. Thereby the negative read voltage VNEG is increased to the second negative target read voltage Vneg2. In this regard, the negative read voltage VNEG slowly increases because the current driving force of the path including the first resistor R1 and the second resistor R2 is comparatively small. Therefore, much time may be required to generate the first negative target read voltage Vneg1.

If the generation of the second negative target read voltage Vneg2 has been completed, the second negative target read voltage Vneg2 is applied to the memory cell array 100 through the row decoder 220. During a period from T5 to T6, data stored in the memory cell array 100 may be outputted and temporarily stored in the page buffers 231.

Figure 5:
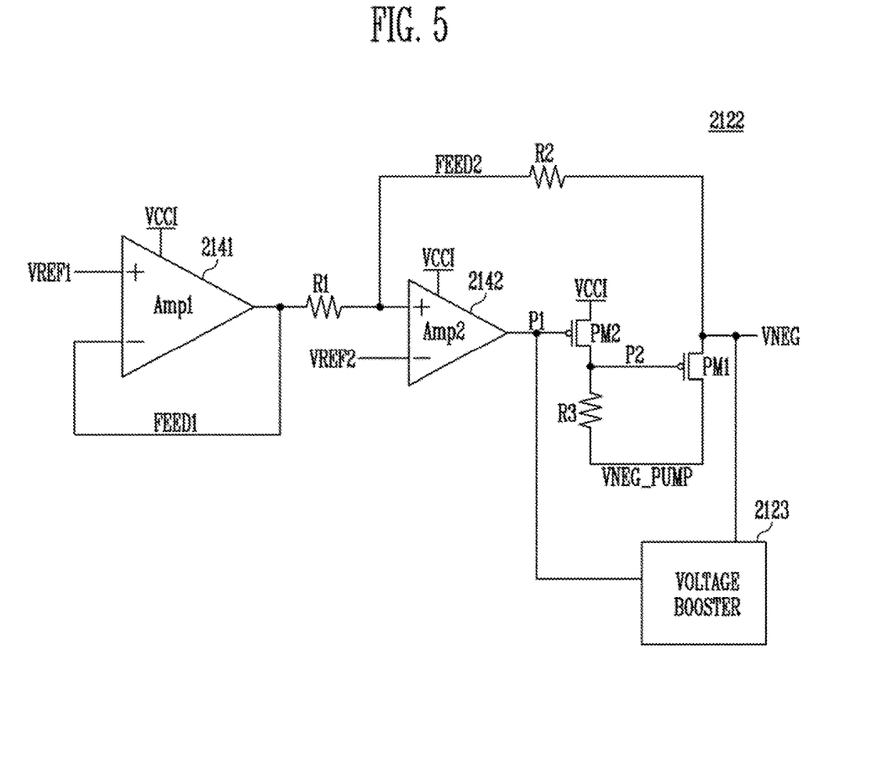
FIG. 5 is a diagram illustrating a negative voltage regulator, according to another embodiment of the present disclosure.

FIG. 5 is a diagram illustrating a negative voltage regulator 5122 according to another embodiment of the present disclosure. The negative voltage regulator 5122 may be employed in the negative voltage generator 212 of FIG. 2 as the negative voltage regulator 2122.

Referring to FIG. 5, the negative voltage regulator of FIG. 5 has the same configuration as the configuration of FIG. 3, except that a voltage booster 5123 is coupled between the output node of the second amplifier circuit 2142 and the negative read voltage VNEG node. In operation, when the voltage level of the negative read voltage VNEG that is the output of the negative voltage regulator 5122 is higher than that of a negative target read voltage, the negative read voltage VNEG receives a negative charge through a first PMOS transistor PM1, with a negative pumping voltage VNEG_PUMP that is the output of the negative voltage pump 2121 as a source. As a result, the voltage level of the negative read voltage VNEG is reduced. For example, description will be made for the case where a start voltage of the negative read voltage VNEG is 0V and the negative target read voltage is −1V. First, when the voltage of the second feed FEED2 becomes higher than the second reference voltage VREF2, P1 that is the output of a second amplifier circuit (Amp2) 2142 becomes a high level. Consequently, P2 at the drain terminal of the second PMOS transistor PM2 becomes a low level, whereby the first PMOS transistor PM1 is turned on. Therefore, a negative charge is transferred from the negative pumping voltage VNEG_PUMP to the negative read voltage VNEG through the first PMOS transistor PM1, so that the voltage level of the negative read voltage VNEG is reduced. The negative read voltage VNEG may be rapidly reduced by using, as the first PMOS transistor PM1, a transistor that has high current driving force. The output P1 of the second amplifier circuit (Amp2) 2142 may be determined by variation of the negative read voltage VNEG. For the negative read voltage VNEG, a feedback loop which is affected by the output of the second amplifier circuit (Amp2) 2142 may be formed.

When the voltage level of the negative read voltage VNEG is lower than that of the target read voltage, the voltage of the second feed FEED2 becomes lower than the second reference voltage VREF2 and P1 becomes a low level. As a result, P2 becomes a high level and the first PMOS transistor PM1 is turned off. A positive charge is transferred to the negative read voltage VNEG via the first resistor R1 and the second resistor R2, with the internal supply voltage VCCI as a source, so that the negative read voltage VNEG is increased. Here, a path including the first resistor R1 and the second resistor R2 through which a positive charge is supplied may have very low current driving force compared to that of the first PMOS transistor PM1.

The third resistor R3 may be configured to provide a sufficiently high resistance to make, when the second PMOS transistor PM2 is turned on, P2 be a voltage close to the internal supply voltage VCCI and thus turn off the first PMOS transistor PM1.

The negative voltage regulator 5122 of FIG. 5 includes the voltage booster 5123. The detailed configuration and operation of the voltage booster 5123 of FIG. 5 will be described below.

The voltage booster 5123 is coupled to an output terminal VNEG of the negative voltage regulator 5122 and is controlled by the output voltage P1 of the second amplifier circuit (Amp2) 2142. When the voltage level of the negative read voltage VNEG is higher than that of a target read voltage, P1 becomes a high level and thus the voltage booster 5123 is inactivated. When the voltage level of the negative read voltage VNEG is lower than that of the target read voltage, P1 becomes a low level and thus the voltage booster 5123 is activated. If the voltage booster 5123 is activated, the negative read voltage VNEG may be rapidly increased. In particular, when the negative read voltage VNEG is undershot to a voltage lower than the negative target read voltage, the voltage booster 5123 may function to rapidly increase the undershoot voltage to the negative target voltage. The voltage booster 5123 may include at least one transistor, the at least one transistor may be coupled to the output terminal VNEG of the negative voltage regulator 5122. In addition, the negative read voltage VNEG may be rapidly increased by the positive charge supplied through the at least one transistor. Here, the at least one transistor may have very high current driving force compared to the current driving force on the path including the first resistor R1 and the second resistor R2. The operation of the at least one transistor may be controlled by a voltage of P1 that is the output of the second amplifier circuit (Amp2) 2142. If P1 is a high level, the at least one transistor may be turned off, while if P1 is a low level, the at least one transistor may be turned on. Therefore, the voltage booster 5123 is controlled so that the output read voltage VNEG of the negative voltage regulator 5122 can rapidly reach the target read voltage.

Figure 6:
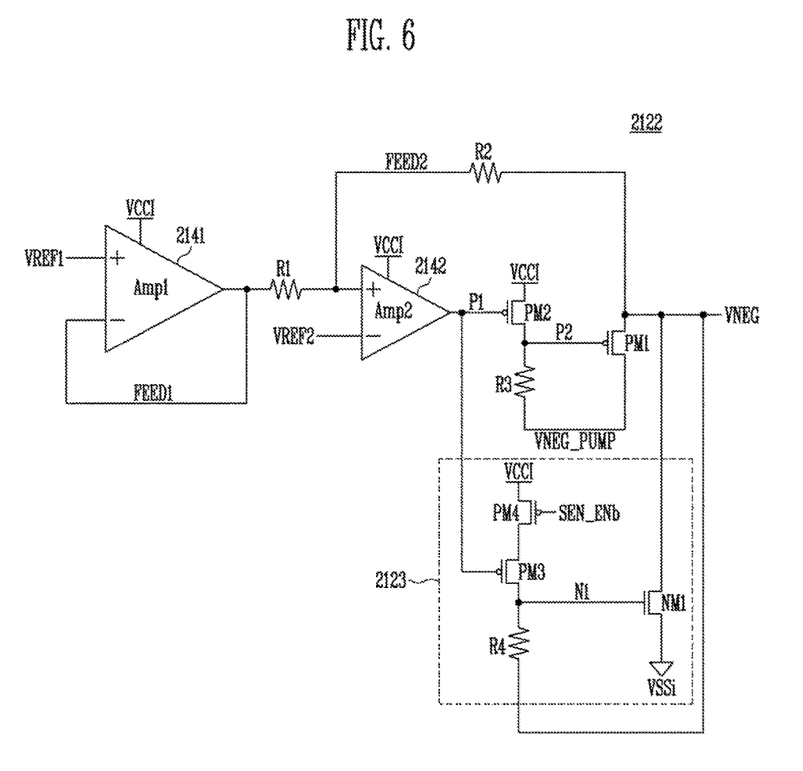
FIG. 6 is a diagram illustrating in more detail the negative voltage regulator of FIG. 5.

FIG. 6 is a diagram illustrating in more detail the negative voltage regulator 5122 of FIG. 5 according to an embodiment of the present disclosure.

Referring to FIG. 6, when the voltage level of the negative read voltage VNEG that is the output of the negative voltage regulator 5122 is higher than that of a negative target read voltage, the negative read voltage VNEG receives a negative charge through a first PMOS transistor PM1, with a negative pumping voltage VNEG_PUMP that is the output of the negative voltage pump 2121 as a source. As a result, the voltage level of the negative read voltage VNEG is reduced. For example, description will be made for the case where a start voltage of the negative read voltage VNEG is 0V and the negative target read voltage is −1V. First, when the voltage of the second feed FEED2 becomes higher than the second reference voltage VREF2, P1 that is the output of a second amplifier circuit (Amp2) 2142 becomes a high level. Consequently, P2 at the drain terminal of the second PMOS transistor PM2 becomes a low level, whereby the first PMOS transistor PM1 is turned on. Therefore, a negative charge is transferred from the negative pumping voltage VNEG_PUMP to the negative read voltage VNEG through the first PMOS transistor PM1, so that the voltage level of the negative read voltage VNEG is reduced. The negative read voltage VNEG may be rapidly reduced by using, as the first PMOS transistor PM1, a transistor that has high current driving force. The output of the second amplifier circuit (Amp2) 2142 may be determined by variation of the negative read voltage VNEG. For the negative read voltage VNEG, a feedback loop which is affected by the output of the second amplifier circuit (Amp2) 2142 may be formed.

When the voltage level of the negative read voltage VNEG is lower than that of the target read voltage, the voltage of the second feed FEED2 becomes lower than the second reference voltage VREF2 and P1 becomes a low level. As a result, P2 becomes a high level and the first PMOS transistor PM1 is turned off. A positive charge is transferred to the negative read voltage VNEG via the first resistor R1 and the second resistor R2, with an internal supply voltage VCCI as a source, so that the negative read voltage VNEG is increased. Here, a path including the first resistor R1 and the second resistor R2 through which a positive charge is supplied may have very low current driving force compared to that of the first PMOS transistor PM1.

The third resistor R3 may be configured to provide a sufficiently high resistance to make, when the second PMOS transistor PM2 is turned on, P2 be a voltage close to the internal supply voltage VCCI and thus turn off the first PMOS transistor PM1.

The negative voltage regulator 5122 of FIG. 6 includes a voltage booster 5123 according to an embodiment of the present disclosure. The detailed configuration and operation of the voltage booster 5123 of FIG. 6 will be described below.

When the negative read voltage VNEG that is the output of the negative voltage regulator 5122 is higher than the target read voltage, P1 at the output of a second amplifier circuit (Amp2) 2142 becomes a high level, whereby a third PMOS transistor PM3 is turned off. In addition, the voltage of N1 at the drain terminal of the third PMOS transistor PM3 is controlled by the negative read voltage VNEG through a fourth resistor R4 and thus becomes a low level. As a result, a first N-channel metal-oxide semiconductor (NMOS) transistor NM1 is turned off.

When the voltage level of the negative read voltage VNEG is lower than that of the target read voltage, the voltage of the second feed FEED2 becomes lower than the second reference voltage VREF2 and P1 becomes a low level. As a result, P2 becomes a high level and the third PMOS transistor PM3 is turned on. In addition, a first voltage boost control signal SEN_ENb becomes a low level and the fourth PMOS transistor PM4 is turned on. As a result, N1 becomes a high level by the internal supply voltage VCCI coupled to the fourth PMOS transistor PM4 and the third PMOS transistor PM3. Therefore, the first NMOS transistor NM1 is turned on and the negative read voltage VNEG is rapidly increased by a positive charge supplied from the internal ground voltage VSSI functioning as a source. The first NMOS transistor NM1 may have high current driving force compared to the current driving force on the path including the first resistor R1 and the second resistor R2. Thus, the negative read voltage VNEG may be rapidly increased. Therefore, when the voltage level of the negative read voltage VNEG is lower than that of the target voltage, the negative read voltage VNEG may be rapidly switched to the target voltage by the voltage booster 5123. The first voltage boost control signal SEN_ENb may be enabled to a low level during a period in which it is required to switch the negative read voltage VNEG to another voltage. Alternatively, the first voltage boost control signal SEN_ENb may be enabled during a predetermined period when the negative read voltage VNEG is switched to another voltage.

The fourth resistor R4 may be configured to provide a sufficiently high resistance to make, when the third PMOS transistor PM3 and the fourth PMOS transistor PM4 are turned on, N1 be to a voltage, which is close to the internal supply voltage VCCI, and at which the first NMOS transistor NM1 can be turned on. When the third PMOS transistor PM3 and the fourth PMOS transistor PM4 are turned off, N1 becomes a voltage level close to the negative read voltage VNEG and thus the first NMOS transistor NM1 may be turned off.

Figure 7:
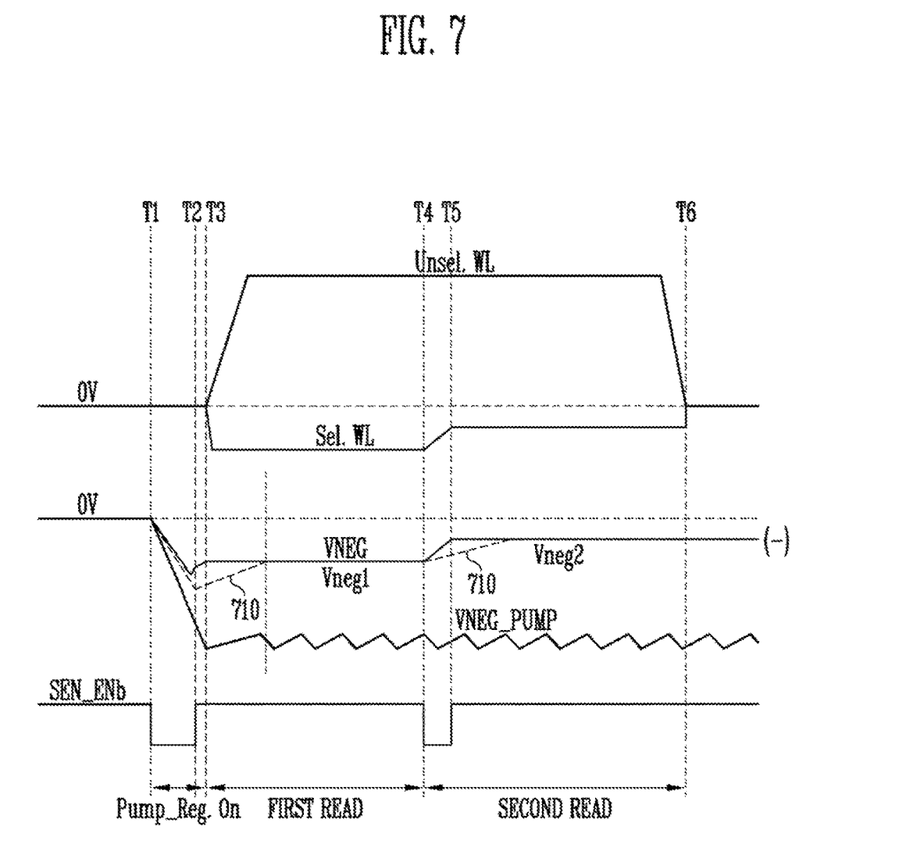
FIG. 7 is a timing diagram illustrating generation of a negative voltage using the negative voltage regulator of FIGS. 5 and 6.

FIG. 7 is a timing diagram illustrating generation of a negative voltage using the negative voltage regulator 5122 of FIGS. 5 and 6.

Referring to FIG. 7, if a read operation is initiated, one of the voltage pumps 2111 and 2121 and one of the voltage regulators 2112 and 5122 (of FIGS. 2 and 5) are first activated to generate a target read voltage. If the target read voltage is a negative voltage, the negative voltage pump 2121 and the negative voltage regulator 5122 are activated. A start voltage of the negative read voltage VNEG that is the output of the negative voltage regulator 5122 may be the ground voltage. A target read voltage of a first read operation is a first negative target read voltage Vneg1. The negative voltage pump 2121 generates a negative pumping voltage VNEG_PUMP equal to or lower than the first negative target read voltage Vneg1. During a period from T1 to T2, P1 of the negative voltage regulator 5122 of FIG. 6 becomes a high level and thus the first PMOS transistor PM1 is turned on, and the negative read voltage VNEG begins to be reduced by a negative charge supplied from the negative pumping voltage VNEG_PUMP through the first PMOS transistor PM1. In this regard, the current driving force of the first PMOS transistor PM1 is higher than that of the path of the first resistor R1 and the second resistor R2, and time required to transfer variation of the negative read voltage to the second feed FEED2 is delayed. Thereby, a undershoot phenomenon in which the negative read voltage VNEG is reduced to a voltage lower than the first negative target read voltage Vneg1 may be caused. During a period from T1 to T2, a first voltage boost control signal SEN_ENb is maintained in a low level and the fourth PMOS transistor PM4 of FIG. 6 is maintained in a turn-on state. In addition, during an early period in the period from T1 to T2, P1 becomes a high level, so that the third PMOS transistor PM3 may be maintained in a turn-off state and the first NMOS transistor NM1 may also be maintained in a turn-off state.

If the negative read voltage VNEG is reduced to a voltage lower than the first negative target read voltage Vneg1 by the first PMOS transistor PM1, P1 becomes a low level, so that the third PMOS transistor PM3 of FIG. 6 is turned on and consequently the first NMOS transistor NM1 is turned on. In this case, the current driving force of the first NMOS transistor NM1 is much higher than that of the path including the first resistor R1 and the second resistor R2. Therefore, the degree by which the first negative read voltage VNEG is undershot below the first negative target read voltage Vneg1 is less than that of the case of FIG. 4. The dotted line 710 of FIG. 7 shows the waveform of the negative read voltage VNEG of FIG. 4. Furthermore, during a late period in the period from T1 to T2, a slope along which the negative read voltage VNEG is increased to the first negative target read voltage Vneg1 may be steeper than that of the case of FIG. 4. If the first voltage boost control signal SEN_ENb is disabled to a high level before the negative read voltage VNEG reaches the first negative target read voltage Vneg1, during a period from T2 to T3, the first NMOS transistor NM1 is turned off and receives a positive charge via the first resistor R1 and the second resistor R2. In addition, the negative read voltage VNEG increases and reaches the first negative target read voltage Vneg1. In this case, the slope of an increase in the negative read voltage VNEG is less than that of the period in which the first NMOS transistor NM1 is turned on.

During a period from T1 to T3, the negative read voltage VNEG can be rapidly and reliably switched to the first negative target read voltage Vneg1 compared to that of the case of FIG. 4.

If the generation of the first negative target read voltage Vneg1 has been completed, the first negative target read voltage Vneg1 is applied to the memory cell array 100 through the row decoder 220 of FIG. 1. During a period from T3 to T4, data stored in the memory cell array 100 may be outputted and temporarily stored in the page buffers 231.

A target voltage of a second read operation is a second negative target read voltage Vneg2. The second negative target read voltage Vneg2 may be higher than the first negative target read voltage Vneg1. Furthermore, as shown in FIG. 7, the first negative target read voltage Vneg1 may be directly switched to the second negative target read voltage Vneg2 without passing through a voltage such as the internal ground voltage VSSI or the internal supply voltage VCCI.

If the second read operation is initiated, during a period from T4 to T5, the first negative target read voltage Vneg1 is switched to the second negative target read voltage Vneg2. Furthermore, when the first negative target read voltage Vneg1 is switched to the second negative target read voltage Vneg2, the first negative target read voltage Vneg1 may be directly switched to the second negative target voltage Vneg2 without passing through a voltage such as the ground voltage or supply voltage that is not present between the first negative target read voltage Vneg1 and the second negative target read voltage Vneg2. Because the second negative target read voltage Vneg2 is higher than the first negative target read voltage Vneg1, during the period from T4 to T5, the current driving force of the first PMOS transistor PM1 is still reduced. Furthermore, a positive charge is transferred to the negative read voltage VNEG through the path including the first resistor R1 and the second resistor R2. Thereby the negative read voltage VNEG is increased to the second negative target read voltage Vneg2. In addition, by the first voltage boost control signal SEN_ENb and the phase of P1, the third and fourth PMOS transistor PM3 and PM4 is turned on and the first NMOS transistor NM1 is turned on. Therefore, the negative read voltage VNEG may be rapidly increased by a positive charge supplied through the first NMOS transistor NM1.

Unlike FIG. 7, if the first voltage boost control signal SEN_ENb is disabled to a high level before the negative read voltage VNEG is increased to the second negative target read voltage Vneg2, the first NMOS transistor NM1 is turned off and receives a positive charge via the first resistor R1 and the second resistor R2. Therefore, the negative read voltage VNEG increases and reaches the second negative target read voltage Vneg2. In this case, the slope of an increase in the negative read voltage VNEG may be less than that of the period in which the first NMOS transistor NM1 is turned on.

The first voltage boost control signal SEN_ENb may be enabled during a predetermined period when the negative read voltage VNEG is switched to another voltage. If the period during which the first voltage boost control signal SEN_ENb is enabled is short, the first NMOS transistor NM1 is turned off before the negative read voltage VNEG reaches the target read voltage, and thus the time it takes to stabilize the target read voltage may be increased. If the period during which the first voltage boost control signal SEN_ENb is enabled is long, because the negative read voltage VNEG is increased to a voltage higher than the target read voltage, the negative read voltage VNEG should be reduced to the target read voltage. Therefore, the time it takes to stabilize the target read voltage may be increased. Accordingly, the first voltage boost control signal SEN_ENb should be controlled to be enabled during the predetermined period having an appropriate range when the negative read voltage VNEG is switched to another voltage.

If the generation of the second negative target read voltage Vneg2 has been completed, the second negative target read voltage Vneg2 is applied to the memory cell array 100 through the row decoder 220 of FIG. 1. During a period from T5 to T6, data stored in the memory cell array 100 may be outputted and temporarily stored in the page buffers 231.

Figure 8:
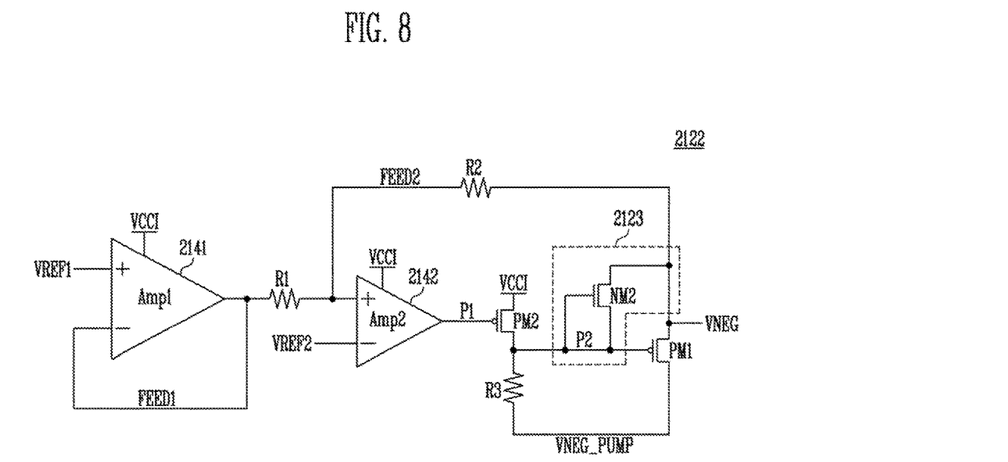
FIG. 8 is a diagram illustrating a negative voltage regulator, according to yet another embodiment of the present disclosure.

FIG. 8 is a diagram illustrating in detail a negative voltage regulator 8122 according to yet another embodiment of the present disclosure.

The negative voltage regulator 8122 is similar to the negative voltage regulator of FIG. 5 except it employs a different voltage booster 8123 instead of voltage booster 2123 which is employed in the embodiment of FIG. 5.

Referring to FIG. 8, when a negative read voltage VNEG that is the output of the negative voltage regulator 8122 is higher than a negative target read voltage, the negative read voltage VNEG receives a negative charge through a first PMOS transistor PM1, with a negative pumping voltage VNEG_PUMP that is the output of the negative voltage pump 2121 as a source. As a result, the negative read voltage VNEG is reduced. For example, description will be made for the case where a start voltage of the negative read voltage VNEG is 0V and a target read voltage is −1V. First, when the voltage of a second feed FEED2 becomes higher than a second reference voltage VREF2, P1 that is the output of a second amplifier circuit (Amp2) 2142 becomes a high level. Consequently, P2 at the drain terminal of the first PMOS transistor PM1 becomes a low level, whereby the first PMOS transistor PM1 is turned on. Therefore, a negative charge is transferred from the negative pumping voltage VNEG_PUMP to the negative read voltage VNEG through the first PMOS transistor PM1, so that the negative read voltage VNEG is reduced. The negative read voltage VNEG may be rapidly reduced by using, as the first PMOS transistor PM1, a transistor that has high current driving force. The output P1 of the second amplifier circuit (Amp2) 2142 may be determined by variation of the negative read voltage VNEG. For the negative read voltage VNEG, a feedback loop which is affected by the output P1 of the second amplifier circuit (Amp2) 2142 may be formed.

When the voltage level of the negative read voltage VNEG is lower than that of the target read voltage, the voltage of the second feed FEED2 becomes lower than the second reference voltage VREF2 and P1 becomes a low level. As a result, P2 becomes a high level and the first PMOS transistor PM1 is turned off. A positive charge is transferred to the negative read voltage VNEG via the first resistor R1 and the second resistor R2, with an internal supply voltage VCCI as a source, so that the negative read voltage VNEG is increased. In this case, the path including the first resistor R1 and the second resistor R2 through which a positive charge is supplied may have very low current driving force compared to that of the first PMOS transistor PM1.

The negative voltage regulator 8122 of FIG. 8 includes a voltage booster 8123 according to another embodiment of the present disclosure. The detailed configuration and operation of the voltage booster 8123 of FIG. 8 will be described below.

When the negative read voltage VNEG is higher than the target read voltage, a second PMOS transistor PM2 is turned off and P2 at the drain terminal of the second PMOS transistor PM2 is a low level. Thereby, the second NMOS transistor NM2 is turned off.

When the negative read voltage VNEG is lower than the target read voltage, the voltage of the second feed FEED2 becomes lower than the second reference voltage VREF2 and P1 becomes a low level. As a result, P2 becomes a high level and the first PMOS transistor PM1 is turned off. A positive charge is transferred to the negative read voltage VNEG via the first resistor R1 and the second resistor R2, with an internal power supply VCCI as a source, so that the negative read voltage VNEG is increased. Furthermore, the second NMOS transistor NM2 is turned on and the negative read voltage VNEG is rapidly increased by a positive charge supplied through the internal power supply VCCI coupled to the second NMOS transistor NM2 and the second PMOS transistor PM2. Because the second NMOS transistor NM2 and the second PMOS transistor PM2 have very high current driving force, the negative read voltage VNEG may be rapidly increased, compared to that of the path including the first resistor R1 and the second resistor R2. The second NMOS transistor NM2 may be embodied in the form of a diode in which a gate terminal and a source terminal are coupled to each other, and may not need a separate control signal.

As the voltage level of the negative read voltage VNEG is lower than that of the target read voltage and the difference between the negative read voltage VNEG and the target read voltage is increased, the current driving force of the second NMOS transistor NM2 may be increased. In addition, as the difference between the negative read voltage VNEG and the target read voltage is reduced by an increase in the negative read voltage VNEG, the current driving force of the second NMOS transistor NM2 is reduced. Therefore, the negative voltage VNEG which is increased by a positive charge supplied through the second NMOS transistor NM2 may not be increased to a voltage higher than the target read voltage. Thereby, the negative read voltage VNEG may reliably reach the target read voltage.

Consequently, when the start voltage is lower than the target read voltage, the start voltage may be more rapidly and more reliably switched to the target read voltage by the voltage booster 8123, whereby the read performance of the memory device may be enhanced.

Figure 9:
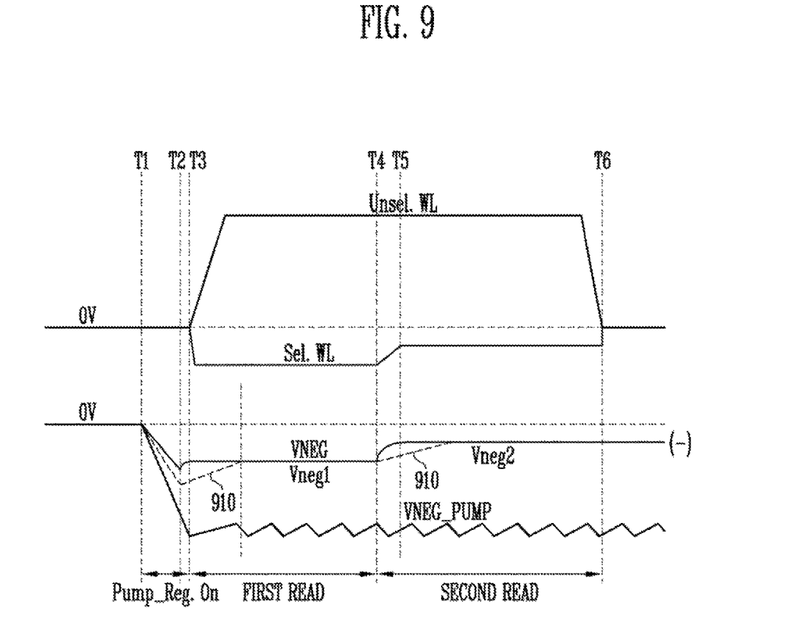
FIG. 9 is a timing diagram illustrating generation of a negative voltage using the negative voltage regulator of FIG. 8.

FIG. 9 is a timing diagram illustrating generation of a negative voltage using the negative voltage regulator 8122 of FIG. 8.

Referring to FIG. 9, if a read operation is initiated, one of the voltage pumps 2111 and 2121 and one of the voltage regulators 2112 and 8122 (See FIGS. 2 and 8) is first activated to generate a target read voltage. If the target read voltage is a negative voltage, the negative voltage pump 2121 and the negative voltage regulator 8122 are activated. A start voltage of the negative read voltage VNEG that is the output of the negative voltage regulator 8122 may be the ground voltage. A target read voltage of a first read operation is a first negative target read voltage Vneg1. The negative voltage pump 2121 generates a negative pumping voltage VNEG_PUMP equal to or lower than the first negative target read voltage Vneg1. During a period from T1 to T2, the first PMOS transistor PM1 of the negative voltage regulator 8122 is turned on, and the negative read voltage VNEG begins to be reduced by a negative charge supplied from the negative pumping voltage VNEG_PUMP through the first PMOS transistor PM1. Here, an undershoot phenomenon may be caused, in which the negative read voltage VNEG is reduced to a voltage lower than the first negative target read voltage Vneg1 by high current driving force of the first PMOS transistor PM1 and low current driving force on the path including the first resistor and the second resistor. If the negative read voltage VNEG is reduced to a voltage lower than the first negative target read voltage Vneg1 by the first PMOS transistor PM1, P1 becomes a low level, so that the second PMOS transistor PM2 is turned on and P2 becomes a high level. Furthermore, the second NMOS transistor NM2 is turned on and thus, during a period from T2 to T3, the negative read voltage VNEG is rapidly increased by a positive charge supplied from the internal power supply VCCI through the path including the second PMOS transistor PM2 and the second NMOS transistor NM2. In this case, the current driving force generated by the second NMOS transistor NM2 and the second PMOS transistor PM2 is much higher than that of the path through the first resistor R1 and the second resistor R2. Therefore, the degree by which the first negative read voltage VNEG is undershot below the first negative target read voltage Vneg1 is less than that of the case of FIG. 4. The dotted line 910 of FIG. 9 shows a waveform of the negative read voltage VNEG of FIG. 4. Furthermore, a slope along which the negative read voltage VNEG is increased to the first negative target read voltage Vneg1 may also be steeper than that of the case of FIG. 4. In addition, the closer the negative read voltage VNEG is to the first negative target read voltage Vneg1, the lower the current driving force of the second NMOS transistor NM2 becomes. Thereby, the slope of an increase in the negative read voltage VNEG may be reduced. As a result, the negative read voltage VNEG may be more rapidly and reliably switched to the first negative target read voltage Vneg1.

If the generation of the first negative target read voltage Vneg1 has been completed, the first negative target read voltage Vneg1 is applied to the memory cell array 100 through the row decoder 220 of FIG. 1. During a period from T3 to T4, data stored in the memory cell array 100 may be outputted and temporarily stored in the page buffers 231.

A target read voltage of a second read operation is a second negative target read voltage Vneg2. The second negative target read voltage Vneg2 may be higher than the first negative target read voltage Vneg1. Furthermore, the first negative target read voltage Vneg1 may be directly switched to the second negative target read voltage Vneg2 without passing through the internal ground voltage VSSI or the internal supply voltage VCCI.

If the second read operation is initiated, during a period from T4 to T5, the first negative target read voltage Vneg1 is increased to the second negative target read voltage Vneg2. Because the second negative target read voltage Vneg2 is higher than the first negative target read voltage Vneg1, during the period from T4 to T5, the current driving force of the first PMOS transistor PM1 is still reduced. Furthermore, a positive charge is transferred to the negative read voltage VNEG through the path including the first resistor R1 and the second resistor R2. Thereby the negative read voltage VNEG is increased to the second negative target read voltage Vneg2. The negative read voltage VNEG is rapidly increased by a positive charge supplied from the internal power supply VCCI via the second NMOS transistor NM2 and the second PMOS transistor PM2 and thus reaches the second target read voltage Vneg2. Furthermore, the closer the negative read voltage VNEG is to the second negative target read voltage Vneg2, the lower the current driving force of the second NMOS transistor NM2 becomes. Thus, as the difference of the negative read voltage VNEG and the second negative target read voltage Vneg2 is more, the slope of the increase of the negative read voltage VNEG is steeper, and as the negative read voltage VNEG is closer to the second negative target read voltage Vneg2, the slope of the increase of the negative read voltage VNEG is flatter. Therefore, the rapid and stable second negative read voltage Vneg2 may be generated.

If the generation of the second negative target read voltage Vneg2 has been completed, the second negative target read voltage Vneg2 is applied to the memory cell array 100 through the row decoder 220 of FIG. 1. During a period from T5 to T6, data stored in the memory cell array 100 may be outputted and temporarily stored in the page buffers 231.

Figure 10:
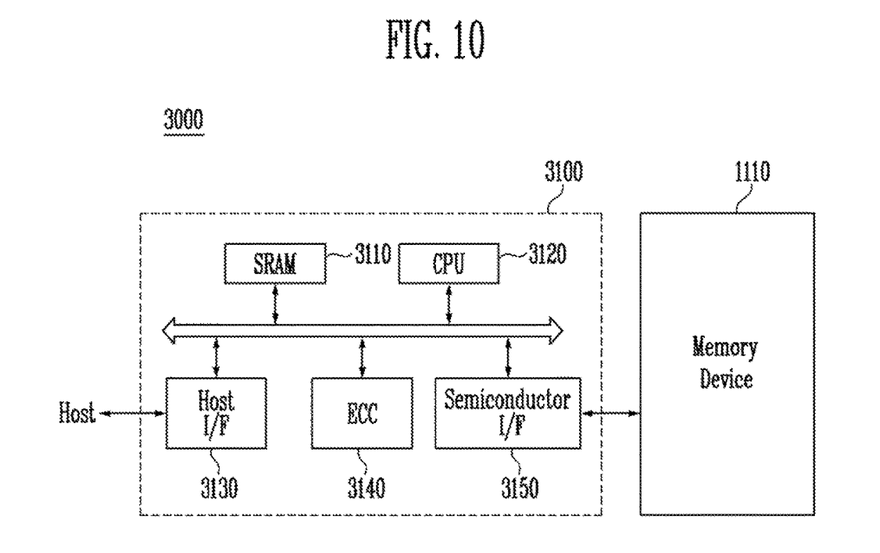
FIG. 10 is a block diagram illustrating a memory system including a memory device according to an embodiment of the present disclosure.

FIG. 10 is a block diagram illustrating a memory system 3000 including a memory device 1110 according to an embodiment of the present disclosure.

Referring to FIG. 10, the memory system 3000 may include the memory device 1110 and the controller 3100. The memory device 1110 may have the substantially same configuration as that of FIG. 1, and therefore, detailed description of the memory device 1110 will be omitted.

The controller 3100 may be configured to control the memory device 1110. A static random access memory (SRAM) 3110 may be used as a working memory of a central processing unit (CPU) 3120. A host interface (I/F) 3130 may include a data exchange protocol of a host coupled to the memory system 3000. An error correction code (ECC) unit 3140 provided in the controller 3100 may detect and correct an error included in data read from the memory device 1110. A semiconductor interface (I/F) 3150 may be configured to interface with the memory device 1110. The CPU 3120 may perform control operations for data exchange of the controller 3100. Although not illustrated in FIG. 11, the memory system 3000 may further include a read only memory (ROM) (not shown) for storing code data to interface with the host.

The memory system 3000 according to the present disclosure may be applied to a device such as a computer, a ultra mobile PC (UMPC), workstation, net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting/receiving information in an wireless environment, one of various devices for forming a home network, or the like.

Figure 11:
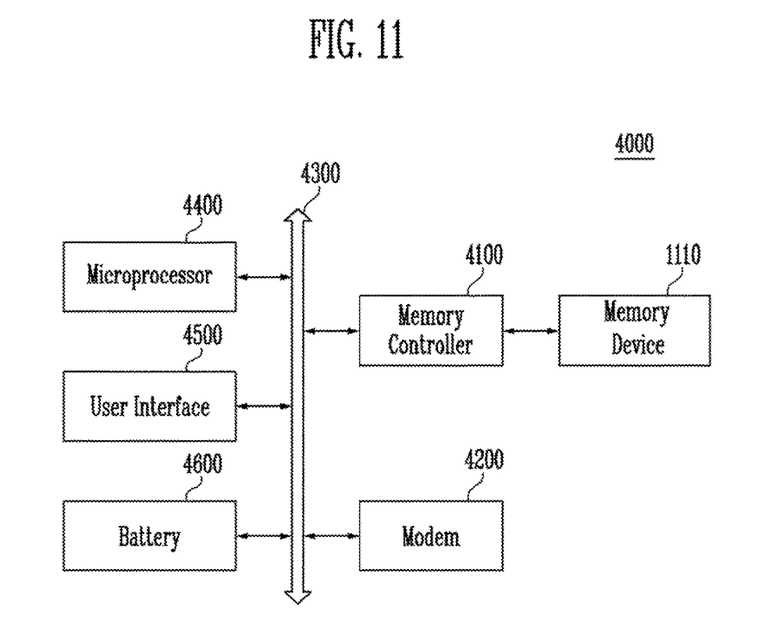
FIG. 11 is a block diagram illustrating a computing system including a memory device according to an embodiment of the present disclosure.

FIG. 11 is a diagram illustrating a computing system 4000 including the memory device 1110 according to the embodiment of the present disclosure.

Referring to FIG. 11, the computing system 4000 may include the memory device 1110, a memory controller 4100, a modem 4200, a microprocessor 4400 and a user interface 4500 which are electrically coupled to a bus 4300. If the computing system 4000 is a mobile device, a battery 4600 may be provided to supply an operating voltage of the computing system 4000. Although not shown in the drawing, the computing system 4000 may further include an application chip set, a camera image processor (CIS), a mobile dynamic random access memory (DRAM), or the like.

The memory device 1110 may have the substantially same configuration as that of FIG. 1, and therefore, detailed description of the memory device 1110 will be omitted.

The memory controller 4100 and the memory device 1110 may form a solid state drive/disk (SSD).

The computing system 4000 may be mounted using various types of packages. For example, the computing system 4000 may be mounted using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), system in package (SIP), multi chip package (MCP), wafer-level fabricated package (WFP), wafer-level processed stack package (WSP), or the like.

As described above, the present disclosure provides an improved negative voltage generator so that the time it takes to generate a read voltage may be reduced, whereby the read performance of a memory device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A voltage generating circuit comprising:
a negative voltage pump configured to generate a first negative voltage; and
a negative voltage regulator configured to generate a second negative voltage using the first negative voltage and output the second negative voltage through an output terminal,
wherein the negative voltage regulator comprises an amplifier circuit configured to be controlled by a voltage of the output terminal, and a voltage booster configured to increase the voltage of the output terminal depending on an output voltage of the amplifier circuit, and
wherein the voltage booster increases the voltage of the output terminal during a predetermined period when the second negative voltage is switched to another voltage.

2. The voltage generating circuit according to claim 1, wherein the amplifier circuit comprises a first and a second amplifier circuits and wherein the voltage booster comprises a first transistor coupled to the output terminal.

3. The voltage generating circuit according to claim 2, wherein the first transistor is controlled by a first control signal and is turned on during a predetermined time in response to the first control signal when a target output voltage of the negative voltage regulator is changed.

4. The voltage generating circuit according to claim 2,
wherein the first transistor is turned on when the voltage of the output terminal is lower than the second negative voltage, and
wherein the voltage of the output terminal is increased by a charge supplied through the first transistor.

5. The voltage generating circuit according to claim 4,
wherein the voltage booster comprises a second transistor including a gate coupled to an output terminal of the first amplifier circuit, and
wherein the second transistor turns on the first transistor when the voltage of the output terminal is lower than the second negative voltage.

6. The voltage generating circuit according to claim 5,
wherein the voltage booster comprises a third transistor coupled to the second transistor and configured to be controlled by a first control signal, and
wherein the first control signal turns on the third transistor during a predetermined time at a time at which an output voltage of the negative voltage regulator is switched.

7. The voltage generating circuit according to claim 4, wherein any one of a source and a drain of the first transistor is coupled to a ground voltage.

8. The voltage generating circuit according to claim 4, wherein the first transistor is turned off when the voltage of the output terminal is higher than the second negative voltage.

9. The voltage generating circuit according to claim 8,
wherein the voltage booster comprises a first resistor coupled to the output terminal, and
wherein the voltage of the output terminal is increased by a charge supplied through the first resistor.

10. The voltage generating circuit according to claim 4,
wherein the negative voltage regulator comprises a second transistor coupled between the output terminal and the negative voltage pump and configured to be controlled by the output voltage of the first amplifier circuit, and
wherein the second transistor is turned on when the voltage of the output terminal is higher than the second negative voltage.

11. The voltage generating circuit according to claim 4, wherein the first transistor is coupled between the output terminal and a second transistor configured to be controlled by the output voltage of the first amplifier circuit.

12. The voltage generating circuit according to claim 11, wherein the first transistor comprises a gate and a source that are coupled to each other.

13. The voltage generating circuit according to claim 11, wherein the first transistor is configured so that as a difference between the voltage of the output terminal and the second negative voltage is reduced, a current driving force of the first transistor is reduced.

14. The voltage generating circuit according to claim 13, wherein the first transistor is turned off when the voltage of the output terminal is higher than the second negative voltage.

15. The voltage generating circuit according to claim 13, wherein the first transistor comprises an N-channel metal-oxide semiconductor (NMOS) transistor.

* * * * *